United States Patent
Yu et al.

(10) Patent No.: US 8,625,053 B2
(45) Date of Patent: Jan. 7, 2014

(54) LIGHT EMITTING DIODE AND BACKLIGHT UNIT AND LIQUID CRYSTAL DISPLAY DEVICE WITH THE SAME

(75) Inventors: Dong Hyun Yu, Gyeonggi-do (KR); Hee Jeong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 265 days.

(21) Appl. No.: 13/167,036

(22) Filed: Jun. 23, 2011

(65) Prior Publication Data

US 2011/0317100 A1 Dec. 29, 2011

(30) Foreign Application Priority Data

Jun. 28, 2010 (KR) .................. 10-2010-0061484
Feb. 24, 2011 (KR) .................. 10-2011-0016780

(51) Int. Cl.
*G02F 1/1335* (2006.01)

(52) U.S. Cl.
USPC ............................................. 349/65; 349/64

(58) Field of Classification Search
None
See application file for complete search history.

(56) References Cited

U.S. PATENT DOCUMENTS

2009/0225256 A1 * 9/2009 Kim .......................... 349/64

FOREIGN PATENT DOCUMENTS

| JP | 2005-294736 A | 10/2005 |
|---|---|---|
| KR | 2007-0074889 | 7/2007 |
| KR | 2009-0003378 | 1/2009 |
| KR | 2009-0101580 | 9/2009 |

OTHER PUBLICATIONS

Korean Office Action dated Jan. 10, 2012 in counterpart Korean patent application.
Chinese Office Action dated Jun. 24, 2013, for corresponding Chinese Application No. 201110184863.5 Note: KR 10-2009-0003378 and KR 10-2009-0101580 already of record.

* cited by examiner

*Primary Examiner* — Lucy Chien
(74) *Attorney, Agent, or Firm* — Morgan, Lewis & Bockius LLP

(57) ABSTRACT

A light emitting diode adapted to improve light efficiency is disclosed. The light emitting diode includes: a light emitting chip; a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction; a second lead frame separated by a fixed distance from the first lead frame; first and second wires configured to connect the first and second lead frames to the light emitting chip, respectively; and a mold frame configured to encompass the first and second lead frames and to include first and second reflection surfaces, which are arranged symmetrically with each other in the first direction of the first lead frame, and third and fourth reflection surfaces which are arranged symmetrically with each other in the second direction of the first lead frame.

17 Claims, 3 Drawing Sheets

LIGHT EMITTING DIODE AND BACKLIGHT UNIT AND LIQUID CRYSTAL DISPLAY DEVICE WITH THE SAME

CROSS-REFERENCE TO RELATED APPLICATION

This application claims priority under 35 U.S.C. 119 to Korean Patent Applications Nos. 2010-0061484 and 2011-0016780, filed on Jun. 28, 2010 and Feb. 24, 2011, which are hereby incorporated by reference in its entirety.

BACKGROUND

1. Field of the Disclosure

This disclosure relates to a light emitting diode, and more particularly to a light emitting diode adapted to improve light efficiency and a backlight unit and a liquid crystal display (LCD) device including the same.

2. Description of the Related Art

Cathode ray tubes (CRTs) correspond to one of display devices which are widely used. The CRTs are mainly used as monitors for TVs, measuring apparatuses, information terminals, and so on. However, the heavy weight and large size of the CRTs have been a major hindrance to the manufacturing of small, light electronic products.

To address this matter, LCD devices are gradually being used in a wide range of applications due to their advantages such as light weight, thin thickness, low power consumption, and others. Furthermore, the LCD devices are being manufactured to have even larger screens, be thinner, and consume less power, in order to meet requirements of users.

Such LCD devices display images by controlling the amount of light transmitted through liquid crystal. However, the LCD devices are not self-illuminating display devices, unlike CRTs. As such, the LCD devices each include a backlight unit configured to have a separate light source, which provides light necessary to display an image, and disposed on the rear surface of an LCD panel. The backlight unit is classified as either an edge type or a direct type in accordance with the disposition of its light source.

The edge type backlight unit includes a light source which is disposed in a position corresponding to a side of the LCD panel. Also, the edge type backlight unit irradiates light emitted from the light source onto the entire surface of the LCD panel using a light guide plate.

On the other hand, the direct type backlight unit includes a plurality of light sources arranged at a fixed distance under the LCD panel. The plurality of light sources directly applies light to the rear surface of the LCD panel. Such a direct type backlight unit can provide a higher brightness and a wider luminescent surface than the edge type backlight unit because it employs plurality of light sources.

The backlight unit includes any one of a lamp and a light emitting diode, as a light source. Recently, the light emitting diode is mainly used in the backlight unit because it easily allows the backlight unit to be thinner and to consume less power. More particularly, a white light emitting diode is used as a light source of the backlight unit. The white light emitting diode makes blue color light generated in a blue color light emitting chip to be transmitted through a fluorescent material and converted into white color light.

The light emitting diode has a long life span and strong directivity of light emission. The light emitting diode can be small-sized, light-weight, driven with a low voltage, and packaged in a variety of shapes. The light emitting diode well endures impact and vibration. Also it does not require a preheating time or a complicated driving circuit. As such, the light emitting diode is expected to be replaced with an incandescent electric lamp, a fluorescent lamp, a mercury lamp, and others within the next few years. Moreover, since the light emitting diode has a large energy band gap, it can output a wide wavelength bandwidth range of light including red light to ultraviolet-ray light. Furthermore, as the light emitting diode has superior physical and chemical stability, it attracts public attention in that it may realize high efficiency and a high output.

However, the light emitting diodes developed up to the present can not satisfy the aspects of light output, light emitting efficiency and cost. As such, the light emitting diode must be improved to have better performance. Particularly, the light efficiency of the light emitting diode is lowered in the process of converting blue light generated from the light emitting chip into white color light by transmitting blue color light through the fluorescent material.

BRIEF SUMMARY

Accordingly, the present embodiments are directed to a light emitting diode that substantially obviates one or more of problems due to the limitations and disadvantages of the related art, and backlight unit and LCD device including the same.

An object of the present embodiments is to provide a light emitting diode which is adapted to improve light efficiency, and a method of fabricating the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a light emitting diode includes: a light emitting chip; a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction; a second lead frame separated by a fixed distance from the first lead frame; first and second wires configured to connect the first and second lead frames to the light emitting chip, respectively; and a mold frame configured to encompass the first and second lead frames and to include first and second reflection surfaces, which are arranged symmetrically with each other in the first direction of the first lead frame, and third and fourth reflection surfaces which are arranged symmetrically with each other in the second direction of the first lead frame.

A backlight unit according to another aspect of the present embodiment includes a printed circuit board provided with a conductive pattern, a emitting diode each configured to include: "a light emitting chip; a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction; a second lead frame separated by a fixed distance from the first lead frame; first and second wires configured to connect the first and second lead frames to the light emitting chip, respectively; and a mold frame configured to encompass the first and second lead frames and to include first and second reflection surfaces, which are arranged symmetrically with each other in the first direction of the first lead frame, and third and fourth reflection surfaces which are arranged symmetrically with each other in the second direction of the first lead frame", and optical sheets configured to scatter and converge light emitted from the light emitting diode.

An LCD device according to still another aspect of the present embodiment includes a light emitting diode mounted to a printed circuit board and configured to include: "a light emitting chip; a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction; a second lead frame separated by a fixed distance from the first lead frame; first and second wires configured to connect the first and second lead frames to the light emitting chip, respectively; and a mold frame configured to encompass the first and second lead frames and to include first and second reflection surfaces, which are arranged symmetrically with each other in the first direction of the first lead frame, and third and fourth reflection surfaces which are arranged symmetrically with each other in the second direction of the first lead frame", optical sheets configured to scatter and converge light emitted from the light emitting diode, and a liquid crystal display panel disposed on the optical sheet.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
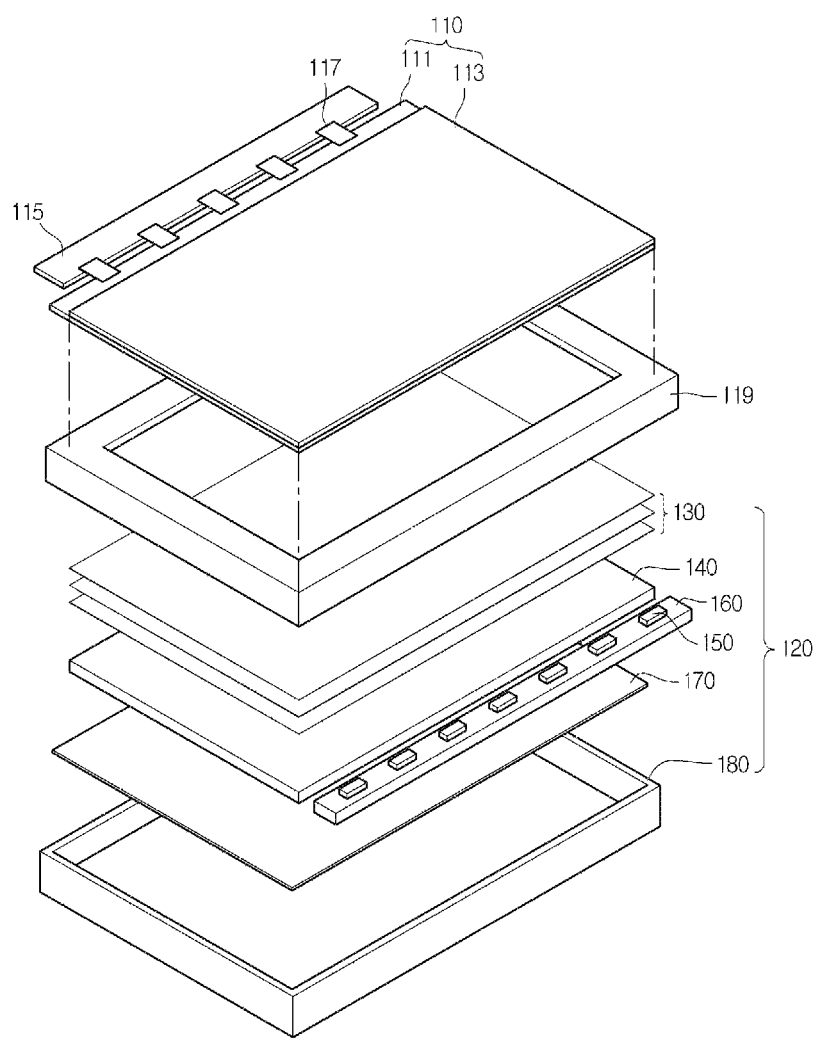
FIG. 1 is a disassembled perspective view showing an LCD device provided with a light emitting diode according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a disassembled perspective view showing an LCD device with a light emitting diode according to an embodiment of the present disclosure As shown in FIG. 1, an LCD device with light emitting diodes according to an embodiment of the present disclosure includes an LCD panel 110 configured to display images, and a backlight unit 120 disposed under the LCD panel 110 and configured to apply light to the LCD panel 110. The LCD device further includes a panel guide 119 configured to support lower edges of the LCD panel 110.

The LCD panel 110 includes a thin film transistor substrate 111 and a color filter substrate 113 disposed opposite each other and combined to maintain a uniform cell gap between them. The LCD panel 110 further includes a liquid crystal layer (not shown) interposed between the two substrates.

Although they are not shown in detail in the drawing, the thin film transistor substrate 111 and the color filter substrate 113 will now be described in detail. The thin film transistor substrate 111 includes a plurality of gate lines and a plurality of data lines formed to cross each other, and thin film transistors formed at the intersections of the plurality of gate lines and the plurality of data lines. The plurality of gate lines and the plurality of data lines crossing each other define the pixels. The thin film transistors are connected to pixel electrodes each included in the pixels, respectively. On the other hand, the color filter substrate 113 includes: red, green, and blue color filters opposite to the pixels; a black matrix configured to rim each of the color filters; and a common electrode formed to cover the color filters and the black matrix. The black matrix is formed to shield the gate lines, the data lines, and the thin film transistors.

Furthermore, the LCD device includes a driver printed-circuit-board (PCB) 115 disposed on an edge of the LCD panel 110. The driver PCB 115 applies driving signals to the gate and data lines on the LCD panel 110. To this end, the driver PCB 115 is electrically connected to the LCD panel 110 by means of COFs (chip on films) 117. The COFs 117 can be replaced with tape carrier packages (TCPs).

The backlight unit 120 disposed under the LCD panel 110 includes a bottom cover 180 with an opened upper surface, a PCB 160 disposed at an inner side surface of the bottom cover 180 and provided with a conductive pattern, a plurality of light emitting diodes 150 loaded on the PCB 160 and configured to each emit light, and a light guide plate 140 disposed parallel with the plurality of light emitting diodes 150. The light guide plate 140 converts spotted lights emitted from the light emitting diodes 150 into two-dimensional light. The backlight unit 120 further includes a reflection sheet 170 disposed under the light guide plate 140 and configure to reflect light progressing downwardly from the light guide plate 140 toward the LCD panel 110, and optical sheets 130 disposed over the light guide plate 140 and configured to scatter and converge incident light from the light guide plate 140.

The light emitting diodes 150 according to the present embodiment can be configured with the combination of red, green and blue light emitting diodes which emit red, green and blue lights, respectively. Alternatively, the light emitting diodes 150 according to the present embodiment can include only white light emitting diodes which emit white light.

Such light emitting diodes 150 according to the present embodiment are formed in a structure having improved light efficiency. The light emitting diode 150 according to the present embodiment will now be described in detail referring to FIGS. 2 through 5.

Figure 2:
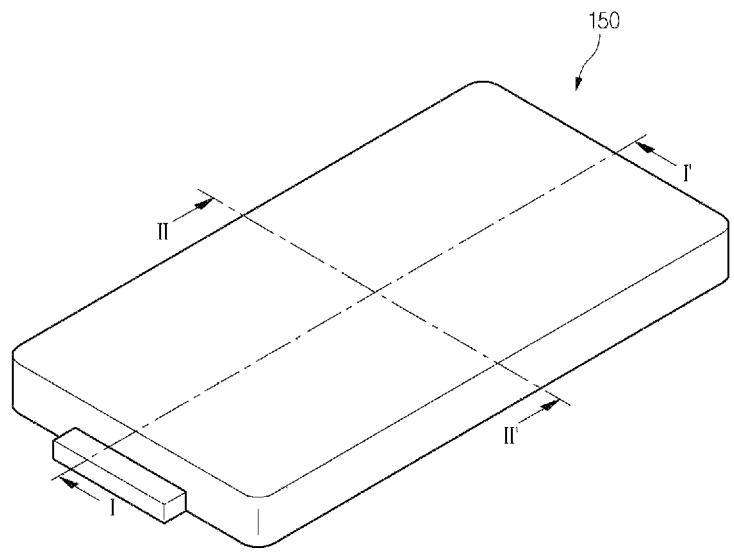
FIG. 2 is a perspective view showing a light emitting diode according to an embodiment of the present disclosure.
Figure 3:
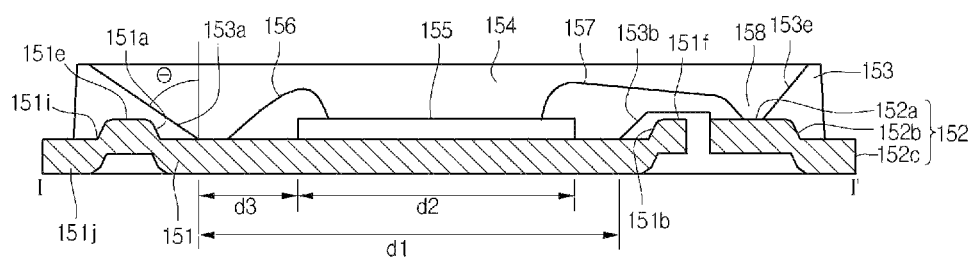
FIG. 3 is a cross-sectional view showing the light emitting diode taken along a line I-I' in FIG. 2.
Figure 4:
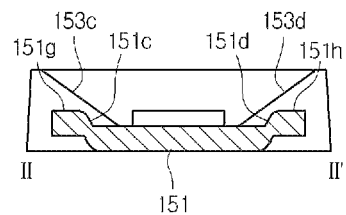
FIG. 4 is a cross-sectional view showing the light emitting diode taken along another line II-II' in FIG. 2.
Figure 5:
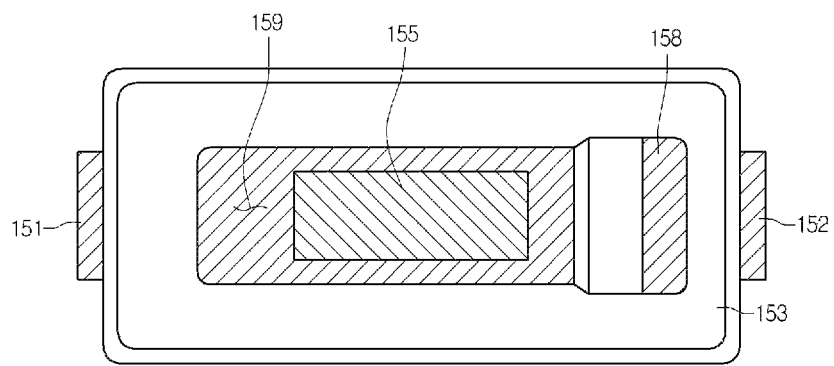
FIG. 5 is a planar view showing the light emitting diode of FIG. 2.

FIG. 2 is a perspective view showing a light emitting diode according to an embodiment of the present disclosure, and FIG. 3 is a cross-sectional view showing the light emitting diode taken along a line I-I' in FIG. 2. Also, FIG. 4 is a cross-sectional view showing the light emitting diode taken along another line II-II' in FIG. 2, and FIG. 5 is a planar view showing the light emitting diode of FIG. 2.

Referring to FIGS. 2 through 5, the light emitting diode 150 according to an embodiment includes first and second lead frames 151 and 152, a light emitting chip 155, a mold frame 153, and a silicon layer 154. The first and second lead frames receive external driving signals, respectively. The light emitting chip 155 is loaded onto the first lead frame 151. The mold frame 153 encompasses the first and second lead frames 151 and 152. The silicon layer 154 is filled in openings which are formed by the mold frame 153.

The light emitting diode 150 further includes first and second wires 156 and 157. The first wire 156 is used for electrically connecting a first electrode pad (not shown) of the light emitting chip 155 with the first lead frame 151. The second wire 157 is used for electrically connecting a second electrode pad (not shown) of the light emitting chip 155 with the second lead frame 152.

The light emitting chip 155 corresponds to a light source substantially generating light. Such a light emitting chip 155 includes a p-type semiconductor and an n-type semiconductor junctioned to each other. The p-type semiconductor provides positive holes and the n-type semiconductor provides electrons.

Although it is not shown in the drawings, the silicon layer covering the light emitting chip 155 is formed to include a fluorescent material. The fluorescent material is used for converting fixed spectrum light, which is generated in the light emitting chip 155, into white light.

The first lead frame 151 includes first through fourth tilted surfaces 151a through 151d configured to incline outwardly and upwardly from a region in which the light emitting chip 155 is disposed. The first and second tilted surfaces 151a and 151b are formed symmetrically with respect to each other in a first direction. The third and fourth tilted surfaces 151c and 151d are formed symmetrically with respect to each other in a second direction which is perpendicular to the first direction.

Also, the first lead frame 151 includes a first flat-topped surface 151e, a fifth tilted surface 151i and a first protrusive portion 151j. The first flat-topped surface is formed to expand from the first tilted surface 151a and to bend to a horizontal direction parallel with the lower surface of the light emitting diode 150. The fifth tilted surface 151i is formed to expand outwardly from the first flat-topped surface 151e and to bend toward the downward direction of the light emitting diode 150. The first protrusive portion 151j is formed to extend from the fifth tilted surface 151i and to protrude outwardly from the light emitting diode 150.

The first lead frame 151 further includes a second flat-topped surface 151f expanded from the second tilted surface 151b. The second tilted surface 151b is formed to bend toward the horizontal direction parallel with the lower surface of the light emitting diode 150.

Furthermore, the first lead frame 151 includes third and fourth flat-topped surfaces 151g and 151h. The third flat-topped surface 151g is formed to expand outwardly from the third tilted surface 151c and to bend toward the horizontal direction parallel with the lower surface of the light emitting diode 150. The fourth flat-topped surface 151h is formed to expand outwardly from the fourth tilted surface 151d and to bend toward the horizontal direction parallel with the lower surface of the light emitting diode 150.

The ordinary light emitting diode generally includes the lead frame of a flat plate type. Due to this, external moisture intrudes into the inner side of the ordinary light emitting diode along the flat lead frame. Conversely, the light emitting diode according to an embodiment includes the above-mentioned lead frame having a bent structure which is formed by the first tilted surface 151a, the first and fifth flat-topped surfaces 151e and 151i and the first protrusive portion 151j. Therefore, the light emitting diode according to an embodiment can prevent the intrusion of the external moisture.

The second lead frame 152 includes a fifth flat-topped surface 152a, a sixth tilted surface 152b and a second protrusive portion 152c. The fifth flat-topped surface 152a is separated by a fixed distance from the first lead frame 151 and disposed parallel with the first and second flat-topped surfaces 151a and 151f. The sixth tilted surface 152b is formed to expand from the fifth flat-topped surface 152a and to bend to the downward direction of the light emitting diode 150. The second protrusive portion 152c is formed to extend from the sixth tilted surface 152b and to protrude in the outward direction of the light emitting diode 150.

In this manner, the second lead frame 152 is provided with the fifth flat-topped surface 152a, the sixth tilted surface 152b and the second protrusive portion 152c. As such the light emitting diode of the present embodiment can be protected from the intrusion of external moisture.

Also, the total area of the first and second lead frames 151 and 152 becomes larger than that of the ordinary lead frames of the flat plate type. Therefore, the first and second lead frames 151 and 152 allow the light emitting diode of the present embodiment to have a superior heat radiation characteristic.

The mold frame 153 has a structure encompassing all edges of the light emitting diode 150. The mold frame 153 can be formed through an extrusion process.

More specifically, the mold frame 153 has a barrier structure encompassing the edges of the light emitting diode 150. Such a mold frame 153 is configured to include first through fifth reflection surfaces 153a through 153e formed to incline downwardly toward inner directions of the light emitting diode 150 (i.e., toward the light emitting chip 155). The first through fifth reflection surfaces 153a through 153e reflect light emitted from the light emitting chip 155 so that light efficiency of the light emitting diode 150 is enhanced.

The first through fourth reflection surfaces 153a through 153d are formed outwardly and upwardly from the region in which the light emitting chip is positioned. The first and second reflection surfaces 153a and 153b have inclined angles symmetrical with respect to each other in the first direction. The third and fourth reflection surfaces 153c and 153d have inclined angles symmetrical with respect to the each other in the second direction which is perpendicular to the first direction connecting the first and second reflection surfaces 153a and 153b with each other.

The fifth reflection surface 153e is separated by a fixed distance from the second reflection surface 153b. However, the fifth reflection surface 153e has the same incline angle as the second reflection surface 153b.

The first and second reflection surfaces 153a and 153b are formed over the first and second tilted surfaces 151a and 151b of the first lead frame 151, respectively. In other the words, the first reflection surface 153a of the mold frame 153 is formed at a slant on the first tilted surface 151a of the first lead frame 151, and the second reflection surface 153b is formed at a slant on the second tilted surface 151b of the first lead frame 151.

The first and second reflection surfaces 153a and 153b are formed at the extrusion process of the mold frame 153. Also, the first and second reflection surfaces 153a and 153b are formed in a constant thickness on the first and second tilted surfaces 151a and 151b.

The first and second reflection surfaces 153a and 153b can have the same incline angles as the first and second tilted surfaces 151a and 151b. However, the first and second reflection surfaces 153a and 153b are not limited to the same incline angles as the first and second tilted surfaces 151a and 151b. In other words, the first and second reflection surfaces 153a and 153b can have other incline angles different from those of the first and second tilted surfaces 151a and 151b.

The incline angles θ of the first and second reflection surfaces 153a and 153b with respect to a reference line, which is defined as an upward direction perpendicular to the lower surface of the light emitting diode 150, is set to 80° or below (or less).

The mold frame 153 is configured to form a first opening hole 159 between the first and second reflection surfaces 153a and 153b. The first opening hole 159 exposes a part of the first lead frame 151 in which the light emitting chip 155 and a first wire 156 can be mounted.

The exposed area of the first lead frame 151 by the first opening hole 150 provides only the area d2 of the light emitting chip 155 and the area for soldering the first wire 156 on the first lead frame 151. In other words, the first opening hole 150 has a minimized size necessary to mount the light emitting chip 155 to the first lead frame 151 and to solder the first wire 156 to the first lead frame 151.

The mold frame 153 is further configured to form a second opening hole 158 between the second and fifth reflection surfaces 153b and 153e. The second opening hole 158 is used for connecting a second wire 157 to the second lead frame 152.

The second opening hole 158 exposed the second lead frame 152 by the area necessary to connect the second wire 157 to the second lead frame 152. In other words, the second opening hole 158 is formed in a larger size than a diameter of the second wire 157 but in a minimized size which can provide only a space for soldering the second wire 157 to the second lead frame 152. As such, the minimized second opening hole 158 can enable light efficiency of the light emitting diode 150 to be enhanced.

The third and fourth reflection surfaces 153c and 153c are formed over the third and fourth tilted surfaces 151c and 151d of the first lead frame 151, respectively. In other words, the third reflection surface 153c of the mold frame 153 is formed at a slant on the third tilted surface 151c of the first lead frame 151, and the fourth reflection surface 153d is formed at a slant on the fourth tilted surface 151d of the first lead frame 151.

The third and fourth reflection surfaces 153c and 153d are formed at the extrusion process of the mold frame 153. Also, the third and fourth reflection surfaces 153c and 153d are formed in a constant thickness on the third and fourth tilted surfaces 151c and 151d.

The third and fourth reflection surfaces 153c and 153d can have the same incline angles as the third and fourth tilted surfaces 151c and 151d. However, the third and fourth reflection surfaces 153c and 153d are not limited to the same incline angles as the third and fourth tilted surfaces 151c and 151d. In other words, the third and fourth reflection surfaces 153c and 153d can have other incline angles different from those of the third and fourth tilted surfaces 151c and 151d.

The incline angles θ of the third and fourth reflection surfaces 153c and 153d with respect to a reference line, which is defined as an upward direction perpendicular to the lower surface of the light emitting diode 150, is set to 80° or below (or less).

As described above, the light emitting diode 150 of the present embodiment includes the first and second lead frames 151 and 152 having bent structures which are implemented by the first through sixth tilted surfaces 151a, 151b, 151c, 151d, 151i and 152b, the first through fifth flat-topped surfaces 151e, 151f, 151g, 151g and 152a, and the first and second protrusive portions 151j and 152c. Therefore, the light emitting diode 150 can be safely protected from the intrusion of external moisture.

Moreover, the light emitting diode 150 of the present embodiment enables the mold frame 153 to include the first through fourth reflection surfaces 153a through 153d which are disposed on the first through fourth tilted surfaces 151a through 151d of the first lead frame 151a through 151d and which each have a high reflectance. As such, the light emitting diode 150 can enhance its light efficiency by 10 percent or more.

Figure 6:
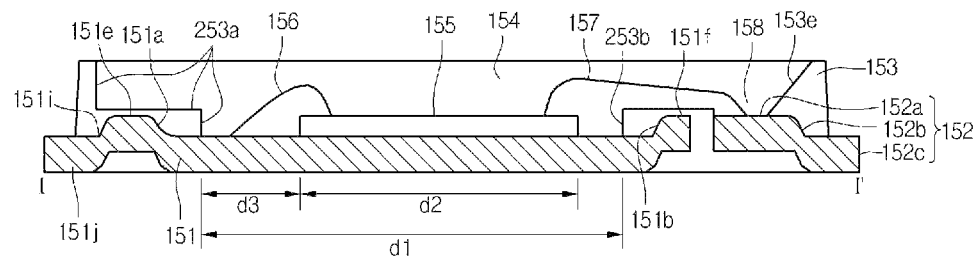
FIG. 6 is a cross-sectional view showing a light emitting diode according to another embodiment of the present disclosure.

FIG. 6 is a cross-sectional view showing a light emitting diode according to another embodiment of the present disclosure.

The light emitting diode of another embodiment shown in FIG. 6 has the same configuration as that of one embodiment of FIG. 3 described above, with the exception of first and second reflection surfaces 253a and 253b. Accordingly, the description of one embodiment to be repeated in another embodiment of the present disclosure will be omitted. Also, the light emitting diode according to another embodiment of the present disclosure will refer to the same reference numbers for the same elements as that according to one embodiment.

The first and second reflection surfaces 253a and 253b are on the first lead frame 151.

The first and second reflection surfaces 253a and 253b are simultaneously formed at an extrusion process of the mold frame 153. Also, the first and second reflection surfaces 253a and 253b are formed in a constant thickness on the first lead frame 151.

The first and second reflection surfaces 253a and 253b are formed parallel to a reference line which is defined as an upward direction perpendicular to the lower surface of the light emitting diode 150. In other words, the first and second reflection surfaces 253a and 253b are formed to be perpendicular to the lower surface of the light emitting diode 150.

The first reflection surface 253 can be formed in an elevated platform structure.

Although they are not shown in the drawing, the mold frame 153 includes third and fourth reflection surfaces which are formed at a right angle to the first and second reflection surfaces 253a and 253b. In the same manner as the first and second reflection surfaces 253a and 253b, the third and fourth reflection surfaces are formed parallel to a reference line which is defined as an upward direction perpendicular to the lower surface of the light emitting diode 150.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A light emitting diode, comprising:
a light emitting chip;
a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction;
a second lead frame separated by a fixed distance from the first lead frame;
first and second wires configured to connect the first and second lead frames to the light emitting chip, respectively; and
a mold frame configured to encompass the first and second lead frames and to include:
first and second reflection surfaces, which are arranged symmetrically with each other in the first direction of the first lead frame; and
third and fourth reflection surfaces, which are arranged symmetrically with each other in the second direction of the first lead frame,
wherein the first lead frame includes:
a first flat-topped surface expanded from the first tilted surface and bent toward a horizontal direction parallel to a lower surface of the light emitting diode,
a fifth tilted surface expanded from the first flat-topped surface and bent at a slant toward the lower surface of the light emitting diode,
a first protrusive portion extended from the fifth tilted surface and protruded outwardly from a side surface of the light emitting diode,
a second flat-topped surface expanded from the second tilted surface and bent toward the horizontal direction parallel to the lower surface of the light emitting diode,
a third flat-topped surface expanded from the third tilted surface and bent toward the horizontal direction parallel to the lower surface of the light emitting diode, and
a fourth flat-topped surface expanded from the fourth tilted surface and bent toward the horizontal direction parallel to the lower surface of the light emitting diode.

2. The light emitting diode claimed as claim 1, wherein the first through fourth reflection surfaces are formed at a slant on the first through fourth tilted surfaces, respectively.

3. The light emitting diode claimed as claim 1, wherein the first through fourth reflection surfaces are formed to have the same incline angle as the first through fourth tilted surfaces.

4. The light emitting diode claimed as claim 1, wherein the second lead frame includes:

a fifth flat-topped surface formed parallel to the first and second flat-topped surfaces;
a sixth tilted surface expanded from the fifth flat-topped surface and bent at a slant toward the lower surface of the light emitting diode; and
a second protrusive portion extended from the sixth tilted surface and protruded outwardly from another side surface of the light emitting diode.

5. The light emitting diode claimed as claim 1, wherein the mold frame is configured to form a first opening hole, between the first and fourth reflection surface, corresponding to an area of the light emitting chip and an area necessary to solder the first wire to the first lead frame.

6. The light emitting diode claimed as claim 4, wherein the mold frame is further configured to form a second opening hole which exposes partially the fifth flat-topped surface and is used for soldering the second wire to the second lead frame.

7. The light emitting diode claimed as claim 1, wherein the first through fourth reflection surfaces are formed to have an incline angle of about 0-80° with respect to a reference line which is defined as a upward direction perpendicular to a lower surface of the light emitting diode.

8. A backlight unit comprising:
a printed circuit board provided with a conductive pattern;
a emitting diode each configured to include:
a light emitting chip;
a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction;
a second lead frame separated by a fixed distance from the first lead frame;
first and second wires configured to connect the first and second lead frames to the light emitting chip, respectively; and
a mold frame configured to encompass the first and second lead frames and to include:
first and second reflection surfaces, which are arranged symmetrically with each other in the first direction of the first lead frame; and
third and fourth reflection surfaces, which are arranged symmetrically with each other in the second direction of the first lead frame; and
optical sheets configured to scatter and converge light emitted from the light emitting diode,
wherein the first lead frame includes:
a first flat-topped surface expanded from the first tilted surface and bent toward a horizontal direction parallel to a lower surface of the light emitting diode,
a fifth tilted surface expanded from the first flat-topped surface and bent at a slant toward the lower surface of the light emitting diode,
a first protrusive portion extended from the fifth tilted surface and protruded outwardly from a side surface of the light emitting diode,
a second flat-topped surface expanded from the second tilted surface and bent toward the horizontal direction parallel to the lower surface of the light emitting diode,
a third flat-topped surface expanded from the third tilted surface and bent toward the horizontal direction parallel to the lower surface of the light emitting diode, and a fourth flat-topped surface expanded from the fourth tilted surface and bent toward the horizontal direction parallel to the lower surface of the light emitting diode.

9. The backlight unit claimed as claim 8, wherein the first through fourth reflection surfaces are formed at a slant on the first through fourth tilted surfaces, respectively.

10. The backlight unit claimed as claim 8, wherein the first through fourth reflection surfaces are formed to have the same incline angle as the first through fourth tilted surfaces.

11. The backlight unit claimed as claim 8, wherein the second lead frame includes:
    a fifth flat-topped surface formed parallel to the first and second flat-topped surfaces;
    a sixth tilted surface expanded from the fifth flat-topped surface and bent at a slant toward the lower surface of the light emitting diode; and
    a second protrusive portion extended from the sixth tilted surface and protruded outwardly from another side surface of the light emitting diode.

12. The backlight unit claimed as claim 8, wherein the mold frame is configured to form a first opening hole, between the first and fourth reflection surface, corresponding to an area of the light emitting chip and an area necessary to solder the first wire to the first lead frame.

13. The backlight unit claimed as claim 11, wherein the mold frame is further configured to form a second opening hole which exposes partially the fifth flat-topped surface and is used for soldering the second wire to the second lead frame.

14. The backlight unit claimed as claim 8, wherein the first through fourth reflection surfaces are formed to have an incline angle of about 0-80° with respect to a reference line which is defined as a upward direction perpendicular to a lower surface of the light emitting diode.

15. A liquid crystal display device, comprising:
    a light emitting diode mounted to a printed circuit board and configured to include:
        a light emitting chip;
        a first lead frame loaded with the light emitting chip and configured to include first through fourth tilted surfaces which expand outwardly from a region loaded with the light emitting diode, the first and second tilted surfaces being arranged symmetrically with each other in a first direction and the third and fourth tilted surfaces being symmetrical with each other in a second direction perpendicular to the first direction;
        a second lead frame separated by a fixed distance from the first lead frame;
        first and second wires configured to connect the first and second lead frames to the light emitting chip, respectively; and
        a mold frame configured to encompass the first and second lead frames and to include:
            first and second reflection surfaces, which are arranged symmetrically with each other in the first direction of the first lead frame; and
            third and fourth reflection surfaces, which are arranged symmetrically with each other in the second direction of the first lead frame;
    optical sheets configured to scatter and converge light emitted from the light emitting diode; and
    a liquid crystal display panel disposed on the optical sheet, wherein the first lead frame includes:
        a first flat-topped surface expanded from the first tilted surface and bent toward a horizontal direction parallel to a lower surface of the light emitting diode,
        a fifth tilted surface expanded from the first flat-topped surface and bent at a slant toward the lower surface of the light emitting diode,
        a first protrusive portion extended from the fifth tilted surface and protruded outwardly from a side surface of the light emitting diode,
        a second flat-topped surface expanded from the second tilted surface and bent toward the horizontal direction parallel to the lower surface of the light emitting diode,
        a third flat-topped surface expanded from the third tilted surface and bent toward the horizontal direction parallel to the lower surface of the light emitting diode, and
        a fourth flat-topped surface expanded from the fourth tilted surface and bent toward the horizontal direction parallel to the lower surface of the light emitting diode.

16. The liquid crystal display device claimed as claim 15, wherein the first through fourth reflection surfaces are formed at a slant on the first through fourth tilted surfaces, respectively.

17. The liquid crystal display device claimed as claim 15, wherein the first through fourth reflection surfaces are formed to have the same incline angle as the first through fourth tilted surfaces.

* * * * *